United States Patent [19]
Naito et al.

[11] Patent Number: 5,386,429
[45] Date of Patent: Jan. 31, 1995

[54] LOW OPERATING CURRENT AND LOW NOISE SEMICONDUCTOR LASER DEVICE FOR OPTICAL DISK MEMORIES

[75] Inventors: Hiroki Naito, Suita; Masahiro Kume, Ohtsu; Hideyuki Sugiura, Takatsuki; Toru Takayama, Nara; Kunio Itoh, Uji; Issei Ohta, Fujiidera; Hirokazu Shimizu, Suita, all of Japan

[73] Assignee: Matsushita Electric Industrial Co., Ltd., Osaka, Japan

[21] Appl. No.: 40,655

[22] Filed: Mar. 31, 1993

[30] Foreign Application Priority Data

| | | | |
|---|---|---|---|
| Mar. 31, 1992 | [JP] | Japan | 4-076710 |
| Jun. 16, 1992 | [JP] | Japan | 4-156559 |
| Sep. 24, 1992 | [JP] | Japan | 4-254537 |
| Sep. 29, 1992 | [JP] | Japan | 4-259303 |
| Oct. 19, 1992 | [JP] | Japan | 4-279907 |
| Oct. 27, 1992 | [JP] | Japan | 4-288553 |
| Dec. 11, 1992 | [JP] | Japan | 4-331498 |

[51] Int. Cl.$^6$ .............................................. H01S 3/19
[52] U.S. Cl. ........................................ 372/46; 372/45
[58] Field of Search ............................. 372/46, 45, 44

[56] References Cited

U.S. PATENT DOCUMENTS 5,279,158  3/1994  Naitou et al. ................. 372/45

Primary Examiner—James W. Davie
Attorney, Agent, or Firm—Ratner & Prestia

[57] ABSTRACT

A semiconductor laser device suitable as a light source for an optical disk may be operated at a low operating current with low noise for the 780 nm band. The device comprises: a certain conduction type $Ga_{1-Y1}Al_{Y1}As$ first light guide layer, a $Ga_{1-Y2}Al_{Y2}As$ second light guide layer of said certain conduction type, or an $In_{0.5}Ga_{0.5}P$ or an $In_{0.5}(GaAl)_{0.5}P$ or an InGaAsP second light guide layer, successively formed one upon another at least in one side of the principal plane of an active layer; an opposite conduction type $Ga_{1-Z}Al_ZAs$ current blocking layer formed on the second light guide layer and provided with a stripe-like window; and a $Ga_{1-Y3}Al_{Y3}As$ cladding layer of the same conduction type as the light guide layers formed on the stripe-like window. The relations of $Z>Y3>Y2$ and $Y1>Y2$ define the AlAs mole fractions.

6 Claims, 9 Drawing Sheets

CURRENT BLOCKING LAYER AlAs MOLE-FRACTION ($X_B$)

LOW OPERATING CURRENT AND LOW NOISE SEMICONDUCTOR LASER DEVICE FOR OPTICAL DISK MEMORIES

BACKGROUND OF THE INVENTION

The present invention relates to a semiconductor laser device suitable as the light source for an optical disc or the like.

A prior art semiconductor laser device will be explained in the following.

FIG. 15 shows a cross-sectional illustration of a prior art semiconductor laser device (refer, for example, to Japanese patent placed to open public S62-73687). On an n-type gallium arsenide (GaAs) substrate 21 are formed successively an n-type gallium aluminum arsenide ($Ga_{0.65}Al_{0.35}As$) cladding layer 22, an active GaAs layer 23 and a first p-type $Ga_{0.75}Al_{0.25}As$ cladding layer 24. Then, an n-type $Ga_{0.51}Al_{0.49}As$ current blocking layer 25 if formed on the first cladding layer 24 for pinching current except for an area where a window 25a for serving as a current channel is formed. Item 26 is a p-type $Ga_{0.75}Al_{0.25}As$ second cladding layer formed in a regrowth process and item 27 is a p-type GaAs contact layer. In the structure of FIG. 15, a current injected to the semi-conductor laser at the p-type GaAs contact layer 27 is confined in the window 25a effectively and the laser oscillation occurs in the GaAs active layer 23 under the window 25a. At this time, the refractive index of the n-type $Ga_{0.51}Al_{0.49}As$ current blocking layer 25 is smaller than that of the p-type $Ga_{0.75}Al_{0.25}As$ second cladding layer 26 and the laser light is also confined in the window 25a effectively. Further, since the energy gap of the n-type $Ga_{0.51}Al_{0.49}As$ current blocking layer 25 is sufficiently larger than that of the GaAs active layer 23, therefore, the n-type $Ga_{0.51}Al_{0.49}As$ current blocking layer 25 will become transparent for the laser light and a semiconductor laser device of small internal loss and low operating current will be obtained.

However, it has been difficult to obtain laser light of the 780 nm band. Since a regrowth process is difficult with the foregoing prior art semiconductor laser device, it has been impossible to increase the AlAs mole-fraction in the p-type $Ga_{0.75}Al_{0.25}As$ first cladding layer 24 with resultant unsatisfactory temperature characteristics. In other words, when a regrowth processing is applied to GaAlAs of a high AlAs mole-fraction, crystallization at the regrowth surface is deteriorated due to the surface oxidation and defects in the current-voltage characteristics will be caused with a resultant necessity of lowering the AlAs mole-fraction of the first cladding layer 24 to some extent. For an easy production, it is necessary to make the AlAs mole-fraction to be less than 0.3. However, there exists a limit in confinement of carriers into the active layer 23 and a semiconductor laser device of excellent temperature characteristics cannot be obtained. Particularly, it will be extremely difficult in this case to realize a visible laser oscillation which requires an AlAs mole-fraction of around 0.5. Besides, a time control etchant is used in the etching process of the stripe-like area and it is difficult to suspend the etching process within the small limit of the thin first cladding layer 24, resulting in a reduction of the yield rate. In addition, it is difficult to realize low noise characteristics required by applications of an optical disc or the like. The reason is that the AlAs mole-fraction of the first cladding layer 24 needs to be set low according to the aforementioned reason and the effective refractive index step in the direction parallel to the junction plane will become large, causing the spectra to be a single mode.

SUMMARY OF THE INVENTION

A semiconductor laser device comprises:
a certain conduction type $Ga_{1-Y1}Al_{Y1}As$ first light guide layer and $Ga_{1-Y2}Al_{Y2}As$ second light guide layer, an opposite conduction type $Ga_{1-Z}Al_ZAs$ blocking layer having a stripe-like window formed on said second light guide layer and a $Ga_{1-Y3}Al_{Y3}As$ cladding layer of said certain conduction type formed over the area including said stripe-like window where said current blocking layer is not being formed, all successively formed one upon another on at least one of the principal planes of an active layer comprised of a $Ga_{1-X}Al_XAs$, wherein relations of $Z>Y3>Y$, $2>X\geq$ and $Y1>Y2$ are established among X, Y1, Y2, Y3 and Z that define the AlAs mole-fractions.

According to the above structure, confinement of carriers in an active layer is determined by the $Ga_{1-Y1}Al_{Y1}As$ first light guide layer having a high AlAs mole-fraction and a regrowth process can take place readily since the regrowth extends to the second light guide layer having a low Al composition. Besides, it will become possible to realize multi-mode spectra by enhancing the AlAs mole-fraction of the first light guide layer with a resultant reduction in the effective refractive index step in the direction parallel to the junction plane.

DETAILED DESCRIPTION OF THE INVENTION

One embodiment example of the present invention will be explained in the following with the help of drawings.

Figure 1:
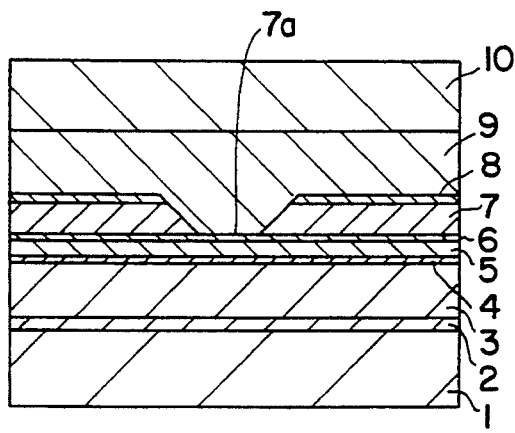
FIG. 1 is a cross-sectional illustration of a semiconductor laser device as one embodiment example of the present invention.

FIG. 1 is a cross-sectional illustration of a semiconductor laser device as one embodiment example of the present invention. On an n-type GaAs substrate 1 are formed in succession an n-type GaAs buffer layer 2, an n-type $Ga_{0.5}Al_{0.5}As$ cladding layer 3, a $Ga_{0.85}Al_{0.15}As$ (generally expressed as $Ga_{1-X}Al_XAs$) active layer 4, a p-type $Ga_{0.5}Al_{0.5}As$ (generally expressed as $Ga_{1-Y1}Al_{Y1}As$) first light guide layer 5, a p-type $Ga_{0.8}Al_{0.2}As$ (generally expressed as $Ga_{1-Y2}Al_{Y2}As$) second light guide layer 6 and an n-type $Ga_{0.4}Al_{0.6}As$ (generally expressed as $Ga_{1-Z}Al_ZAs$) current blocking layer 7 which is formed on an area except for a window 7a serving as a current channel for pinching currents. Item 8 is a $Ga_{0.8}Al_{0.2}As$ protecting layer, item 9 is a $Ga_{0.5}Al_{0.5}As$ (generally expressed as $Ga_{1-Y3}Al_{Y3}As$) cladding layer and item 10 is a p-type GaAs contact layer.

In order to have a stable single lateral mode oscillation, the AlAs mole-fraction of the current blocking layer 7 is to be set higher than that of the p-type $Ga_{0.5}Al_{0.5}As$ cladding layer 9. When the AlAs mole-fraction of the current blocking layer 7 is the same as that of the cladding layer 9, lowering in the refractive index within the stripe will take place due to a plasma effect and a wave guide for anti-guide will be formed with a resultant failure in generating a single lateral mode oscillation. The lateral mode oscillation will become by no means stable when the AlAs mole-fraction of the current blocking layer 7 is lower than that of the p-type $Ga_{0.5}Al_{0.5}As$ cladding layer 9. In the present example, the AlAs mole-fraction of the current blocking layer 7 was set to 0.6, higher by 0.1 than that of the p-type $Ga_{0.5}Al_{0.5}As$ cladding layer 9.

According to this structure, the current injected through the p-type GaAs contact layer 10 was confined within the window 7a and a laser oscillation of the 780 nm band was generated in the $Ga_{0.85}Al_{0.15}As$ active layer 4 located under the window 7a. The AlAs mole-fraction of the p-type $Ga_{0.5}Al_{0.5}As$ first light guide layer 5 was set to be sufficiently higher than that of the active layer 4 so that carriers were confined effectively in the active layer 4 and an oscillation in the visible spectra with excellent temperature characteristics was realized. More specifically speaking, the AlAs mole-fraction needed to be higher than 0.45 for a laser oscillation of the 780 nm band having excellent temperature characteristics of more than 150 K. in the characteristic temperature. A mole-fraction value of 0.5 was used in this particular example.

Figure 15:
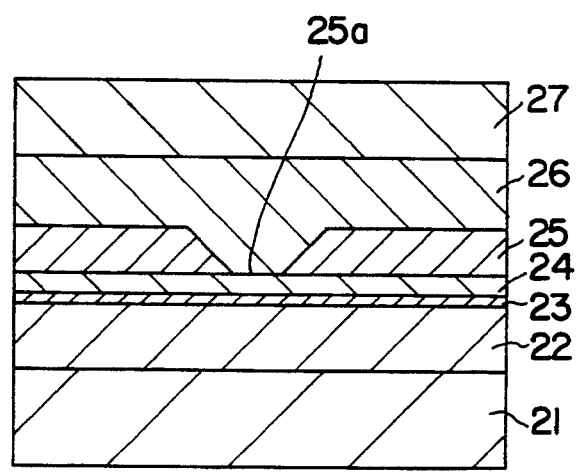
FIG. 15 shows a prior art semiconductor laser device.

According to the prior art structure as shown in FIG. 15, crystal growth on the first light guide layer was needed. However, when a regrowth process was applied to a layer with the AlAs mole-fraction of higher than 0.3, the problem of surface oxidation was caused with resultant difficulties in realizing a semiconductor laser working in the visible spectra with excellent temperature characteristics. In order to solve this problem, the second light guide layer 6 of a low mole-fraction was applied to the first light guide layer 5. In other words, the regrowth process was applied to the p-type $Ga_{0.8}Al_{0.2}As$ second light guide 6 having a low mole-fraction as shown in FIG. 1 and any surface oxidation problem did not result at all. Specifically speaking, the second light guide layer 6 was desired to be smaller than 0.3 in the AlAs mole-fraction for the ease of the regrowth process and also desired to be transparent for the laser oscillation wave length. In this particular embodiment example, an AlAs mole-fraction of 0.2 was used. Besides, the layer thickness was desired to be less than 0.05 um so as not to affect the light distribution too much. A layer thickness of 0.03 um was used in this example. Thus, it has become possible to realize an oscillation in the visible spectra with a carrier confining layer (the first light guide layer) and another layer for regrowth processing (the second light guide layer) formed separately. As described in the foregoing, it suffices generally that the following relations are established among X, Y1, Y2, Y3 and Z that define the AlAs mole-fractions:

$$Z > Y3 > Y2 > X \geqq 0, \quad Y1 > Y2$$

Figure 2A:
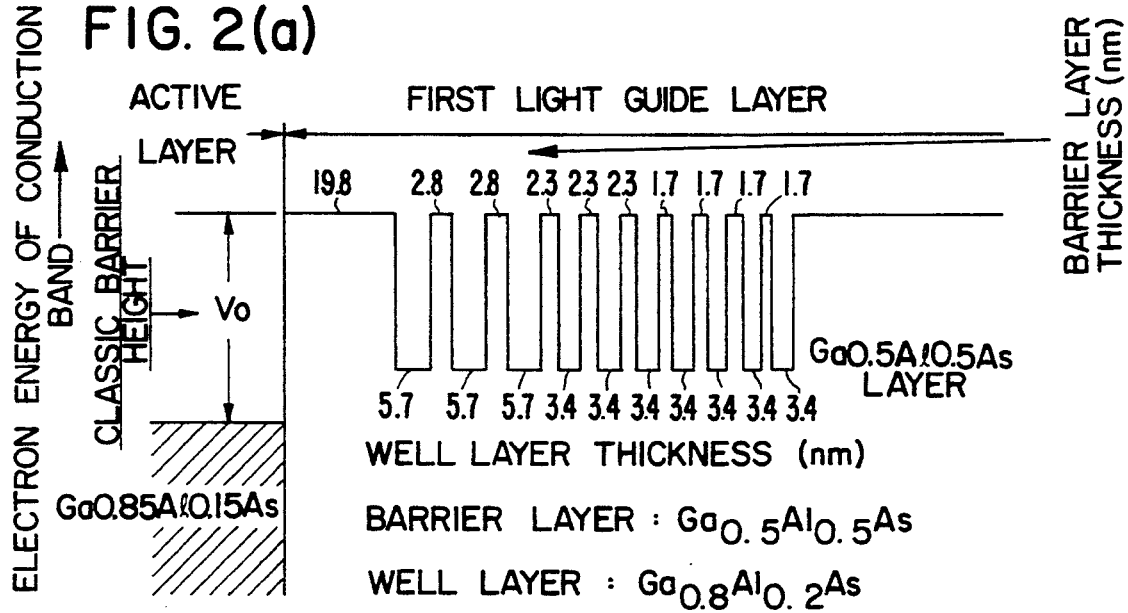
FIG. 2(a) shows a multi-quantum barrier structure and FIG. 2b shows the calculation results of reflectivity against electrons in one embodiment example of the present invention.
Figure 2B:
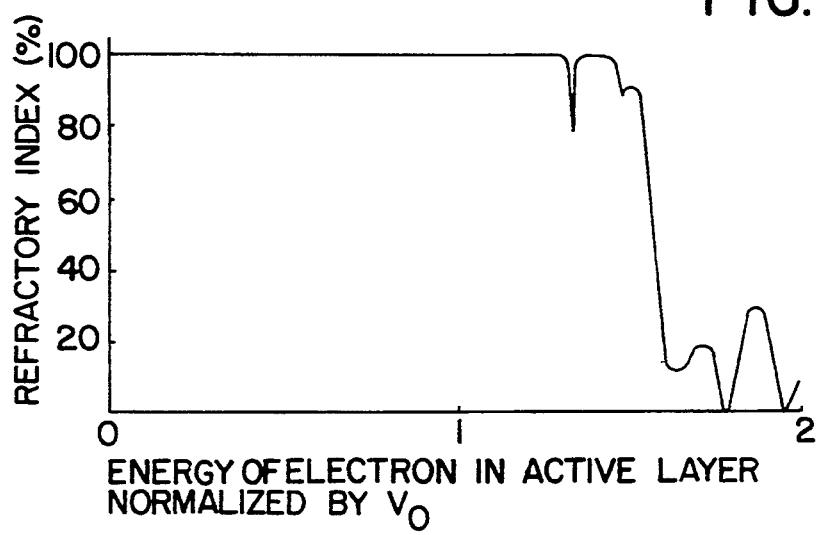

For improving the confinement of carriers in the active layer with this structure, there is a method of introducing a multi-quantum barrier structure showing a high reflectivity against electron waves in the first light guide layer 5. FIG. 2(a) shows the potential energy structure of the multi-quantum barrier. The multi-quantum barrier structure formed near the active layer 4 of the first light guide layer 5 serves to prevent an overflow of electrons from the active layer 4. The multi-quantum barrier structure is comprised of two kinds of semiconductor layers forming a periodic structure through combining a well layer and a barrier layer. The AlAs mole-fraction of the barrier layer was 0.5, the same as that of the cladding layer. An AlAs mole-fraction of 0.2, higher than that of the active layer, was used for the well layer in order to avoid absorption against laser light. According to the quantum dynamics, high energy electron waves can be reflected on the active layer as the layer thickness of the barrier layer and that of the well layer are reduced respectively. Consequently, it has become possible to perform a more excellent electron confinement in the active layer compared with the case wherein an ordinary double hetero-junction is employed, resulting in an improvement of the characteristic temperature. However, as the barrier layer becomes thinner, the degree of electron penetration increases due to the tunnel effect. In consideration of this tunnel effect, the barrier layer thickness was larger near the active layer and smaller away from the active layer for the present embodiment example. FIG. 2(b) shows the calculation results of reflectivity for this structure. The barrier height of the active layer and that of the cladding layer against electrons are defined as the classic barrier height ($V_0$) when there is no multi-quantum barrier structure and then it has become known that the reflectivity against electron waves can be made almost 100% reaching an electron energy height level of as high as 1.3 times the classic barrier height $V_0$ by introducing the multi-quantum barrier structure, which makes it possible to confine the high energy carrying electrons, activated at high temperature, within the active layer effectively. In other words, the introduction of the multi-quantum barrier structure realizes a semiconductor laser device having excellent temperature characteristics and extremely small electron overflows from the active layer at high temperature. It is needless to say that the structure of the multi-quantum barrier can be different from the foregoing as long as the reflectivity of electron waves stays high. Also, the first light guide layer as a whole can be made as the multi-quantum barrier.

Since the forbidden band width of the n-type $Ga_{0.4}Al_{0.6}As$ current blocking layer 7 is larger than that of the $Ga_{0.85}Al_{0.15}As$ active layer 4, no light absorption due to the current blocking layer takes place, resulting in realization of a device having a small wave guide loss and a low operating current.

Besides, there is no light absorption by the current blocking layer with this structure and so laser light tends to be extending to the lower part of the n-type $Ga_{0.4}Al_{0.6}As$ current blocking layer 7 and becomes multi-mode in spectra, resulting in ready realization of a low noise laser device. However, it is needed to make somewhat small the refractive index step in the direction parallel to the junction plane. For that purpose, it will be desirable to make small the refractory index of the layer existent between the active layer and the current blocking layer. In terms of mole-fraction, the AlAs mole-fraction of the first light guide layer 5 needs to be made as high as that of the cladding layer.

Figure 3:
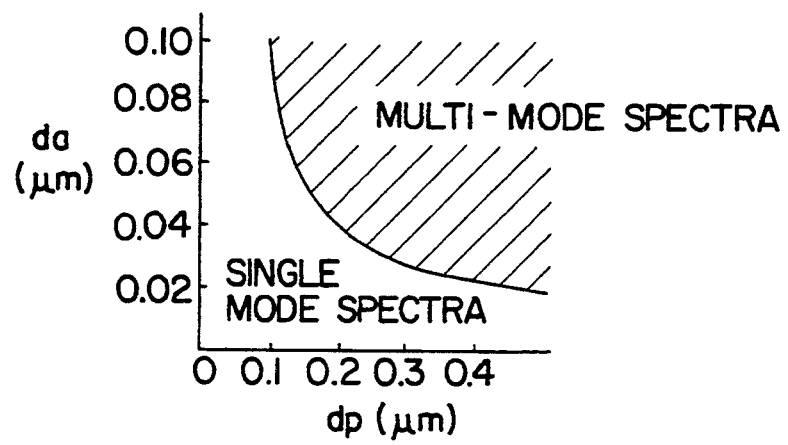
FIG. 3 shows a relation between the spectral characteristics and the structural parameters.

FIG. 3 shows the experiment results about a relation between the spectral characteristics and the structural parameters for one embodiment example of the present invention. It is seen that a multi-mode oscillation takes place over a broad range of the active layer thickness (da) and the first light guide layer thickness (dp) with the wave length of the 780 nm band. The second light guide layer thickness was 0.03 um and the effective refractive index step was $6 \times 10^{-3}$ max. in the direction parallel to the junction plane of the multi-mode device. According to the present invention, there occurs no light absorption by a current blocking layer and a small effective refractive index step is realized, resulting in generation of a multi-mode oscillation even in the regions where da and dp are small. Since small dp is tolerated, low noise laser light will be obtained under the condition where the leakage current out of the stripe section is small. Particularly, the low noise and high output power laser light can be realized for the reason that small da can be tolerated.

When Te in case of the liquid phase epitaxial growth method or Se in case of the metalorganic chemical vapor deposition method (MOCVD), as has been often used so far as an impurity, is added to produce each respective GaAlAs layer capable of guiding light and the n-type $Ga_{0.5}Al_{0.5}As$ cladding layer 3 and the n-type $Ga_{0.4}Al_{0.6}As$ current blocking layer 7 according to the present embodiment example, these impurities will serve as the DX center causing the saturable absorption effect at the light density of the main mode whereby an oscillation ranging from several mW to several tens mW is taking place. As a result, a loss grating is formed against the standing wave of the oscillating main mode to suppress all other modes than the oscillating main mode, leading to enhancement of the convergence to a single mode.

In order to solve this problem, Si was added as an impurity to each respective GaAlAs layer capable of guiding light with the embodiment examples of the present invention. Si has a different activation energy to thermally capture or release carriers between the Dx center level and the conductive band in the GaAlAs when compared with Te or Se, and light absorption is saturated at a very low light density with a resultant failure in forming a loss grating against the oscillating main mode. Therefore, realization of a low noise performance is facilitated without hurting a multi-mode spectral performance. From the same grounds, use of Si is effective in achieving a multi-mode spectral performance and also a low noise performance through high frequency superposition. In other words, with a device structure wherein the effective refractive index step in the direction parallel to the junction plane is made to be large and the spectra of the oscillation mode is made to be a single mode, a method of achieving a multi-mode spectral performance by superposing highfrequency on the operating current has been so far practiced. However, when compared with the case wherein a loss grating is formed by use of Te or Se, use of Si makes it easier to achieve a multi-mode spectral performance and a low noise performance, as well.

Figure 4:
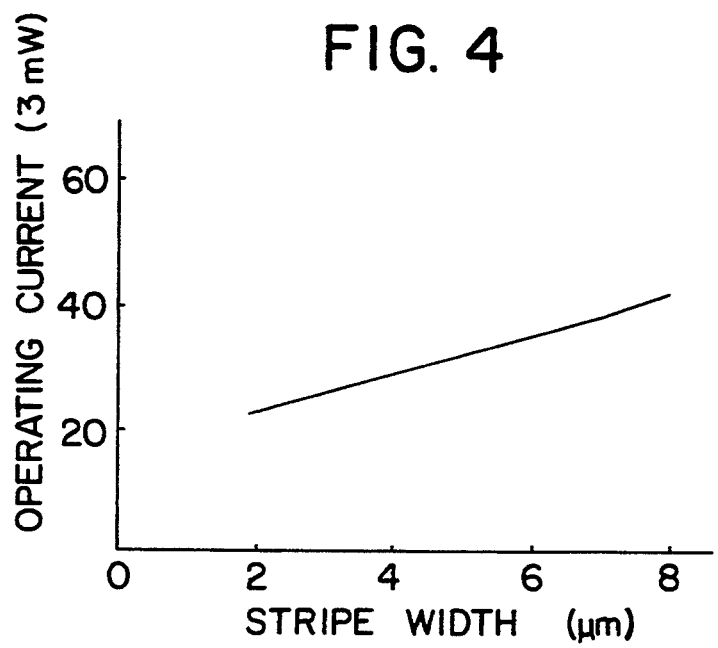
FIG. 4 shows a relation between the operating current and the stripe width.

FIG. 4 shows a relation between the stripe width (width of the window 7a) and the operating current. With the present invention's structure, the operating current was decreased as the stripe width was reduced. When the stripe width was reduced, the spectral multi-mode performance was enhanced since light penetration into the current blocking layer 7 was relatively increased when compared with the light staying within the stripe. Accordingly, as the stripe width is made to be narrower, the low noise performance will be further improved.

Figure 5:
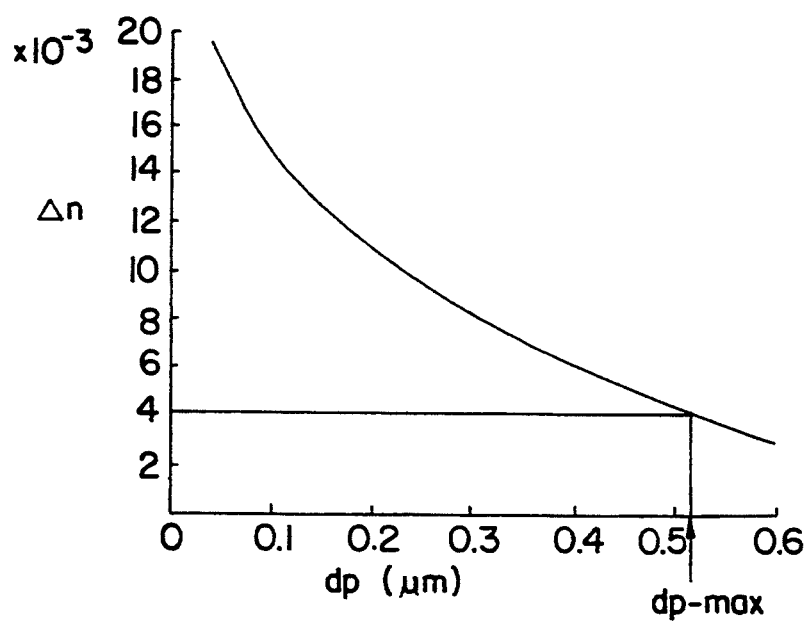
FIG. 5 shows a relation between the thickness (dp) of a first light guide layer and the effective refractive index step (n).
Figure 6:
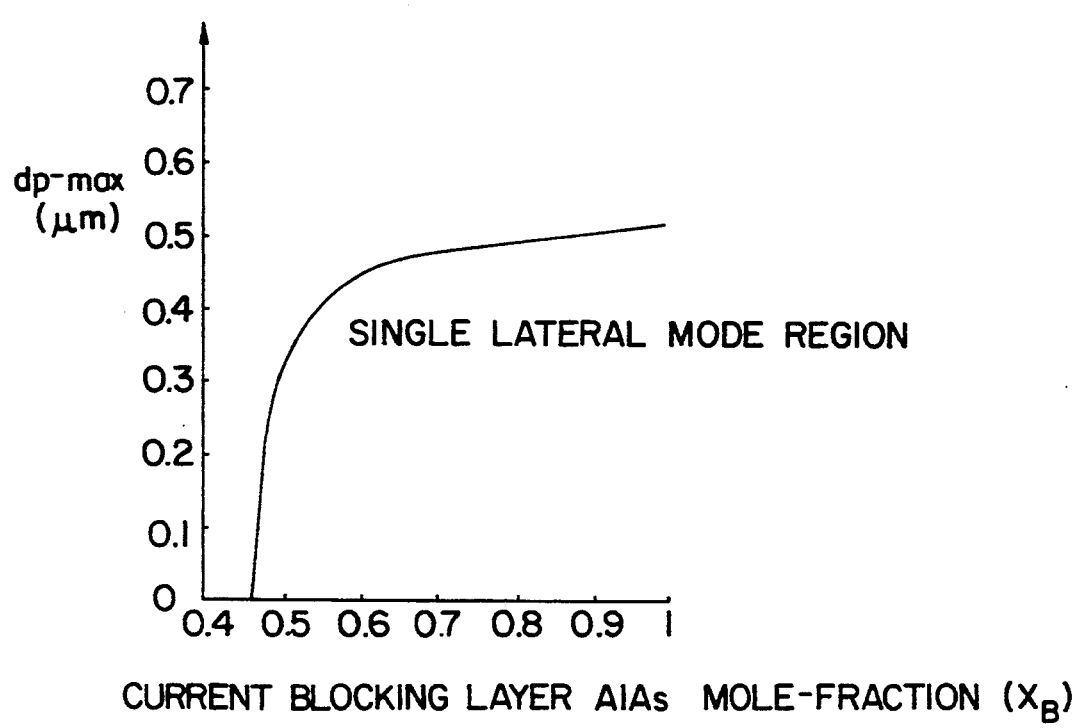
FIG. 6 shows a relation between the mole-fraction ($X_B$) of a current blocking layer and the maximum thickness (dp-max) of a first light guide layer wherein a single lateral mode is realized.

Here, the design values of the thickness dp of the first light guide layer 5 will be examined. First, the upper limit of dp will be discussed. In order to maintain a stable single lateral mode by preventing the wave guide channels from becoming anti-guides due to a reduction in the refractive index within a stripe caused by the plasma effect, the effective refractive index step n existent between inside and outside the stripe has to be larger than a certain limit. The case wherein the active layer 4 is a bulk GaAlAs will be explained. In order to prevent the wave guide channels from becoming anti-guides due to a reduction in the refractive index inside the stripe caused by the plasma effect, the effective refractive index step $\Delta n$ needs to be more than $4 \times 10^{-3}$ inclusive. FIG. 5 shows a relation between the effective refractive index step $\Delta n$ and the first light guide layer thickness dp when the current blocking layer is comprised of AlAs that maximizes the effective refractive index step $\Delta n$ existent between inside and outside the stripe. Here, the AlAs mole-fraction of the first light guide layer 5 and also that of the ntype cladding layer was made to be 0.45, the minimum required to have an oscillation occurred in the 780 nm band. Also, the active layer thickness da was made to be 0.03 um, which would give 25° as the vertical beam divergence angle $\theta_v$. Under the condition of $\theta_v < 25°$, an increase in the threshold value will result and da=0.03 um will be practically the lowest limit, where $\Delta n$ will become the maximum. It will be known from FIG. 5 that when the current blocking layer 7 is comprised of AlAs, the condition of $dp \leq 0.51$ um needs to be satisfied to meet the requirement of $\Delta n \geq 4 \times 10^{-3}$. Accordingly, when the current blocking layer 7 is comprised of AlAs, the condition of $dp \leq 0.51$ um needs to be satisfied in order to realize a single lateral mode oscillation. However, the upper limit of this dp is dependent on the AlAs mole-fraction of the current blocking layer 7. As the AlAs mole-fraction of the current blocking layer 7 is lowered, the effective refractory index step n for the same dp will become smaller and the upper limit of dp will also be smaller. FIG. 6 shows a relation between the dp, where $\Delta n$ equals to $4 \times 10^{-3}$ (referred to as $dp_{-max}$) and the mole-fraction of the current blocking layer 7. The region below the curve in FIG. 6 indicates the material that realizes a single lateral mode oscillation and the device needs to be prepared by using this material. When the active layer thickness is larger than the above or the AlAs mole-fraction of the cladding layer is higher than the above, the value of $dp_{-max}$ will become a little smaller than the value of FIG. 6. All in all, the value of dp needs to be at least 0.51 um for a single lateral mode oscillation.

Figure 7:
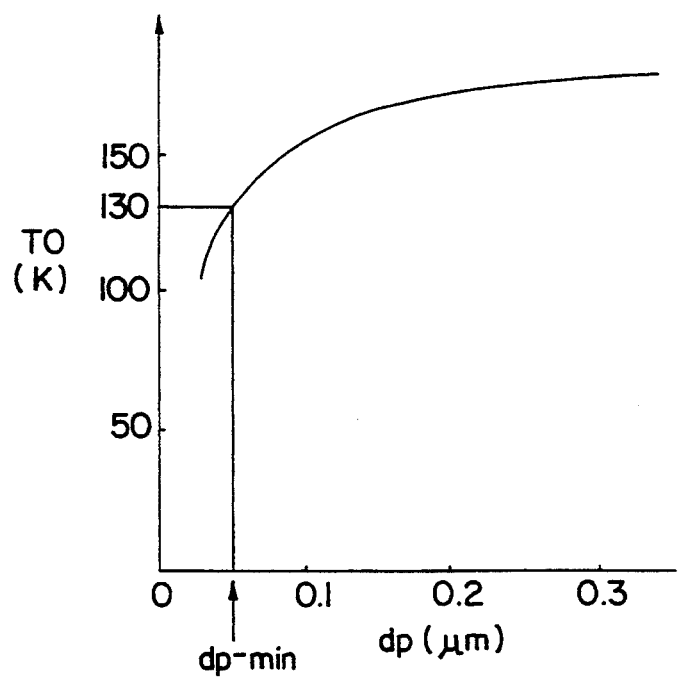
FIG. 7 shows a relation between the thickness (dp) and the characteristic temperature ($T_o$).

In the next, a description will be made on the lowest limit of dp. FIG. 7 shows a relation between the dp and the characteristic temperature $T_o$. Under the condition of $dp \leq 0.05$ um, the leak current will increase as temperature becomes higher, resulting in a problem of the deteriorated characteristic temperature $T_o$ of the semiconductor laser device. A decrease in $T_o$ leads to a decrease in reliability and $T_o$ needs to be higher than 130 K. Therefore, the condition of $dp \geq 0.05$ um needs to be satisfied for achieving good reliability.

As described in the foregoing, the minimum requirement for realizing a high reliability semiconductor laser device by confining a lateral mode in a stable manner according to the refractive index step $\Delta n$ existent between inside and outside the stripe proves to be that the first light guide thickness dp meets the condition of 0.05 um$\leq dp \leq$0.51 um.

Further, the condition of $\Delta n \geq 6 \times 10^{-3}$ needs to be met for the purpose of operating the device only in a single mode in terms of the spectra. According to FIG. 5, the dp needs to be less than 0.4 um inclusive ($dp \leq 0.4$ um) in order to satisfy the foregoing condition. Therefore, the minimum requirement for realizing a semiconductor laser device having a stable lateral mode and a spectral single mode proves to be satisfying the condition of 0.05 um$\leq dp \leq$0.4 um.

Figure 8:
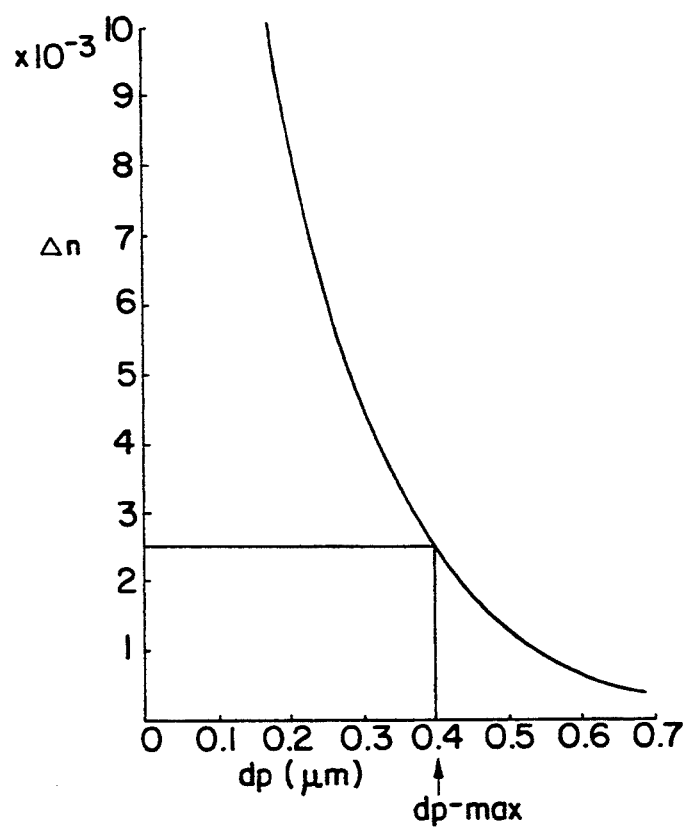
FIG. 8 shows a relation between the thickness (dp) of a first light guide layer performing as a quantum well active layer and the effective refractory index step (n).

Now, the case where the active layer 4 is formed of a quantum well structure will be discussed. The effective refractive index step $\Delta n$ between inside and outside the stripe needs to be more than $2.5 \times 10^{-3}$ inclusive in order to prevent the wave guide channels from acting as anti-guides through lowering of the refractory index within the stripe due to the plasma effect. FIG. 8 shows a relation between the effective refractive index step $\Delta n$ existent between inside and outside the stripe and the first light guide thickness dp for a laser device comprising a current blocking layer 7 formed of AlAs, five of $Ga_{0.7}Al_{0.3}As$ barrier layer providing $\theta_v = 25°$ and a quantum well structured active layer consisting of four of $Al_{0.05}Ga_{0.95}As$ well layer, each having thickness of 4 nm. In the case of the quantum well structured active layer, too, the threshold value increases in the range of $\theta_v < 25°$. So, the $\Delta n$ becomes largest with the present design example. With other quantum well structured active layers wherein the relation of $\theta_v > 25°$ holds, the $\Delta n$ will become smaller than the above. The AlAs mole-fraction of both the first light guide layer and the n- or p-type cladding layer was made to be 0.45. From FIG. 8, it will become known that the condition of $dp \leq 0.40$ um needs to be satisfied for meeting the condition of $\Delta n \geq 2.5 \times 10^{-3}$. Under the condition of $dp \leq 0.05$ um, the characteristic temperature $T_o$ will be lowered, the same way as was for a bulk active layer. Therefore, the first guide layer thickness dp needs to be satisfying the condition of 0.05 um$\leq dp \leq$0.40 um for obtaining a high reliability semiconductor laser device through confining a lateral mode in a stable manner, making use of the refractive index step $\Delta n$ existent between inside and outside the stripe. For an operation only in a single mode in terms of the spectra, the condition of $\Delta n \geq 6 \times 10^{-3}$ needs to be satisfied. According to FIG. 8, the foregoing means the relation of $dp \leq 0.26$ um to be established. Therefore, the first light guide layer thickness dp must meet the condition of 0.05 um$\leq dp \leq$0.26 um in order to realize a semiconductor laser device having a stable lateral mode and a single mode in spectra.

In the next, the front facet reflectivity of an epitaxially grown layer will be discussed. In the application of a semiconductor laser device to a writable optical disc, an optical output exceeding 30 mW in writing and low noise characteristics of $-130$ dB/Hz at 3 mW in writing are required of the device. With the high output semiconductor laser devices of the prior art, noises were exceedingly high because of a single spectral mode and, for a reduction of noises, a spectral multiplication method through high frequency superposition has been employed at the time of writing. As shown in FIG. 3, with the semiconductor laser device of the present invention, it is possible to realize the spectral multi-mode even for a thin active layer and the high output power laser of low noise can be generated even without using any high frequency superposition. In the next, how to design the front facet reflectivity will be described for the case wherein da and dp are defined in the single spectral mode region.

Figure 9:
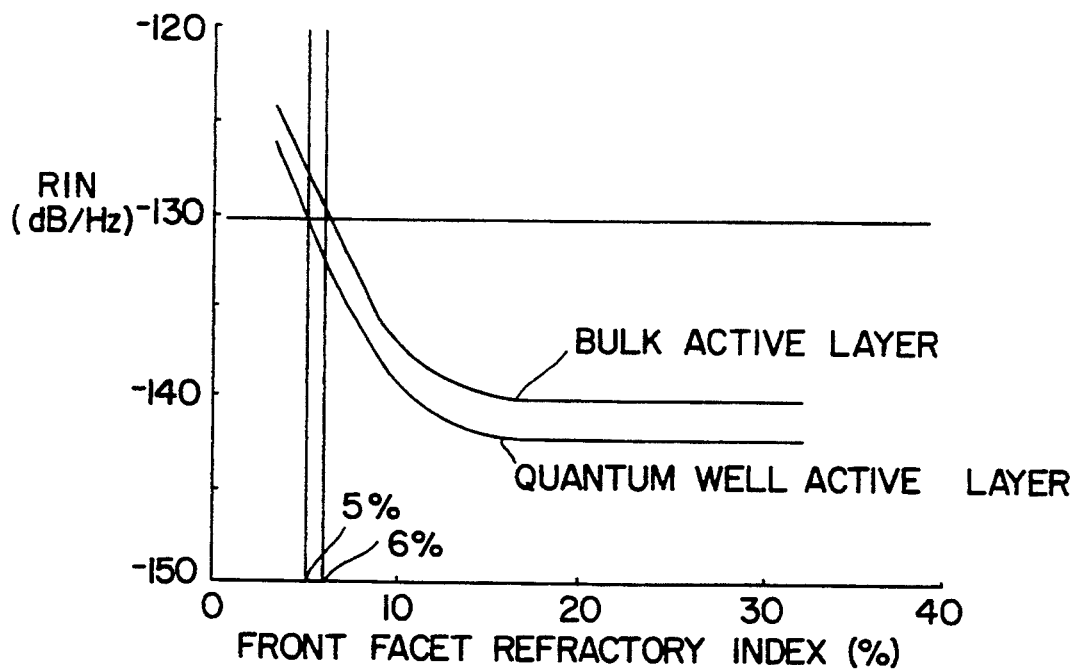
FIG. 9 shows a relation between the front facet reflectivity and the noise characteristics RIN.
Figure 10:
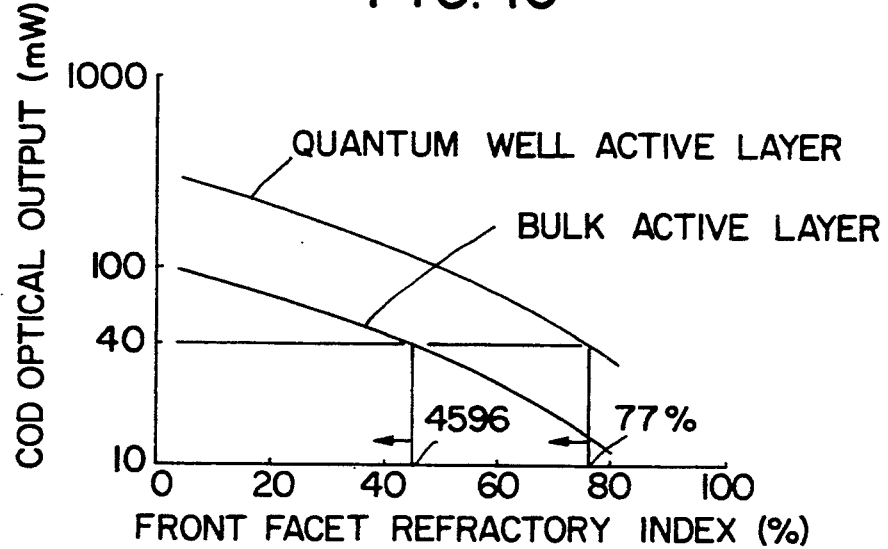
FIG. 10 shows a relation between the front facet reflectivity and the catastrophic optical damage (COD) level.

FIG. 9 shows a relation between the front facet reflectivity and the noise characteristics when high frequency was superposed. The optical output was 3 mW, the optical feedback was 5.5%, the optical-path length was 50 mm, the superposing frequency was 600 MHz, the measurement frequency was t MHz and the band width was 3 KHz. It is learned from FIG. 9 that the front facet reflectivity needs to be more than 6% in case of a bulk active layer in order to achieve $-130$ dB/Hz and below as the low noise characteristics. Also, a relation between the front facet reflectivity and the COD (catastrophic optical damage) level is shown in FIG. 10. The COD level exceeding 40 mW will be required for an assurance of good reliability at 30 mW and it is learned from FIG. 10 that the reflectivity needs to be below 45% inclusive.

From the foregoing it can be said that the front facet reflectivity should be somewhere between 6 to 45% for the optical source of optical disc applications and the reflectivity of 11% was used in the embodiment examples of the present invention.

Besides, in applying the device in an optical disc, the light fedback from the optical disc may sometimes reach the semiconductor laser device substrate. This fedback light might be further reflected at the substrate surface and superposed on the detector signal causing tracking noises. As a countermeasure against this, the front facet reflectivity of the substrate is to be made lower than that of the epitaxially grown layer. Accordingly, by setting up the front facet reflectivity of the epitaxially grown layer as was in the foregoing and the reflectivity of the substrate side only at a lower level, an increase in tracking noise and the like can be suppressed.

FIG. 11 shows a series of the fabrication steps of a semiconductor laser device in one embodiment example of the present invention.

Figure 11A:
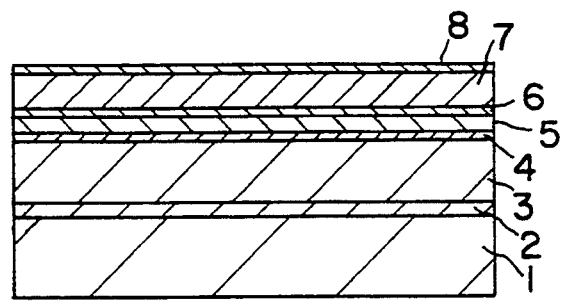
FIGS. 11a–11e show fabrication steps of a semiconductor laser device as one embodiment example of the present invention.

As shown in FIG. 11(a), on an n-type GaAs substrate 1 were formed successively one upon another either by the MOCVD or MBE method an n-type GaAs buffer layer 2 (0.5 um thick), an n-type $Ga_{0.5}Al_{0.5}As$ cladding layer 3 (1 um thick), a $Ga_{0.85}Al_{0.15}As$ active layer 4 (0.04 um thick), a p-type $Ga_{0.5}Al_{0.5}As$ first light guide layer 5 (0.22 um thick), a p-type $Ga_{0.8}Al_{0.2}As$ second light guide layer 6 (0.03 um thick), an n-type $Ga_{0.4}Al_{0.6}As$ current blocking layer 7 (0.5 um thick) and a $Ga_{0.8}Al_{0.2}As$ protective layer 8 (0.01 um thick). The protective layer 8 is needed to prevent the upper surface of the n-type $Ga_{0.4}Al_{0.6}As$ current blocking layer 7 from surface oxidation. The mole-fraction of the protective layer 8 is desired to be less than 0.3 inclusive for the ease of regrowth, the same as required of the second light guide layer, and also to be transparent against laser light. The active layer thickness and the first light guide layer thickness were respectively established so as to make $\Delta n$ equal to $5\times 10^{-3}$ for obtaining a stable single lateral mode. In FIG. 11, the active layer 4 and the protective layer 8 can be p-type, n-type or undoped although not mentioned.

Figure 11B:
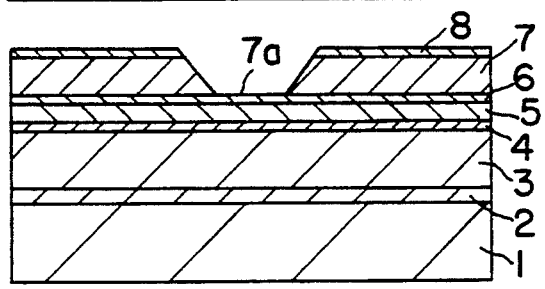

Then, as shown in FIG. 11(b), a stripe-like window 7 was formed through etching and by means of a photolithography method. As the etching method, such an etchant as tartaric acid or sulfuric acid that does not show much selectivity against the AlAs mole-fraction was used and the etching process was applied to the $Ga_{0.4}Al_{0.6}As$ current blocking layer 7 until the process proceeded half-way across the layer. Then, an etching process was applied selectively on the $Ga_{0.4}Al_{0.6}As$ current blocking layer 7 using an etchant of hydrogen fluoride acid system capable of etching off the high AlAs mole-fraction layer selectively. At this time, a second etching process could be applied with the protective layer 8, having eliminated of resist, used as a mask. In this second etching process, the p-type $Ga_{0.8}Al_{0.2}As$ second light guide layer 6 served as an etching stop layer contributing to a reduction in variation of the etching extent with resultant enhancement of yield rates. The stripe width was 2.0 um.

As the composition of the hydrogen fluoride acid etchant, the one having a weight ratio of 5 to 50% to water was used. When the weight ratio falls short of 5%, the current blocking layer will not be etched off and when it exceeds 50% the etching rate will become too fast and uncontrollable and also the resist serving as a mask will be eroded.

Also, an etchant prepared by diluting the hydrogen fluoride acid with ammonium fluoride can be used. In this case, the weight ratio of the hydrogen fluoride acid to the ammonium fluoride is to be ranging from 25% to 80%. When the ratio falls short of 25%, the current blocking layer will not be etched off and, when it exceeds 80%, the etching rate will become too fast and uncontrollable and also the resist serving as a mask will be eroded.

Further, a mixed solution of hydrogen fluoride acid and an acid that does not work alone itself as an etchant for the GaAlAs can also be used as an etchant. An embodiment example of this will be explained in the next.

An etchant prepared by including a mixture of phosphoric acid and hydrogen fluoride acid, for example, can be used. In this case, the weight ratio of the hydrogen fluoride acid to the phosphoric acid is to be ranging from 5% to 50%. When the ratio falls short of 5%, the current blocking layer will not be etched off and, when it exceeds 50%, the etching rate will become too fast and uncontrollable and also the resist serving as a mask will be eroded.

An etchant prepared by including a mixture of sulfuric acid and hydrogen fluoride acid can also be used. In this case, the weight ratio of the hydrogen fluoride acid to the sulfuric acid is to be ranging from 5% to 80%. When the ratio falls short of 5%, the current blocking layer will not be etched off and, when it exceeds 80%, the etching rate will become too fast and uncontrollable and also the resist serving as a mask will be eroded.

Also, an etchant prepared by including a mixture of hydrochloric acid and hydrogen fluoride acid can be used. In this case, the weight ratio of the hydrogen fluoride acid to the hydrochloric acid is to be ranging from 5% to 80%. When the ratio falls short of 5%, the current blocking layer will not be etched off and, when it exceeds 80%, the etching rate will become too fast an uncontrollable and also the resist serving as a mask will be eroded.

An etchant prepared by including a mixture of tartaric acid and hydrogen fluoride acid can also be used. In this case, the weight ratio of the hydrogen fluoride acid to the tartaric acid is to be ranging from 5% to 80%. When the ratio falls short of 5%, the current blocking layer will not be etched off and, when it exceeds 80%, the etching rate will become too fast an uncontrollable and also the resist serving as a mask will be eroded.

An etchant prepared by including a mixture of acetic acid and hydrogen fluoride acid can also be used. In this case, the weight ratio of the hydrogen fluoride acid to the acetic acid is to be ranging from 5% to 80%. When the ratio falls short of 5%, the current blocking layer will not be etched off and, when it exceeds 80%, the etching rate will become too fast an uncontrollable and also the resist serving as a mask will be eroded.

Figure 12A:
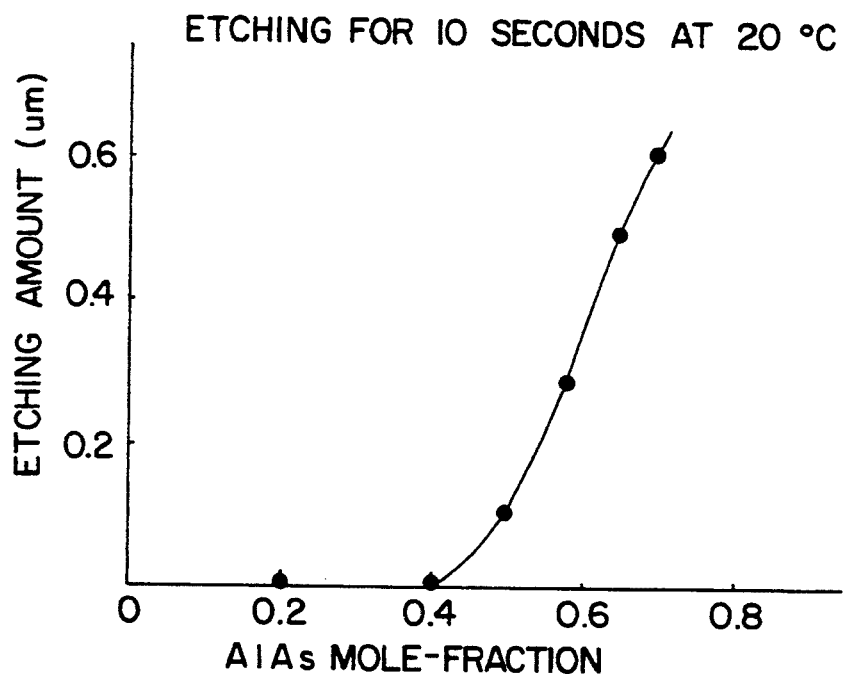
FIGS. 12(a) and 12(b) show how etching processes are dependent on the AlAs mole-fractions and time, respectively.

In order to activate reaction, hydrogen peroxide can be added to the foregoing mixed solutions of acids. Also, the mixed solutions can be diluted by water or ammonium fluoride for a reduction of etching rate. The etchant used with the present example comprised hydrogen fluoride (50% concentration), phosphoric acid (86% concentration) and hydrogen peroxide in volumes of 800 cc, 2400 cc and 1 cc respectively. In this case, the weight ratio of hydrogen fluoride to water was 54% and that to phosphoric acid was 19%. FIG. 12 shows a relation between the etching amount and the mole-fraction and also a relation between the etching amount and the etching time for this particular etchant. From FIG. 12(a), it is learned that the etchant works selectively only on a composite with the AlAs mole-fraction exceeding 0.4. According to this character of the etchant, the current blocking layer only can be etched off selectively from the surface of the second light guide layer. This character is exhibited not only by this particular etchant but also by all the foregoing etchants comprising solutions mixed with hydrogen fluoride. The etching selectivity does not depend on temperature.

Figure 12B:
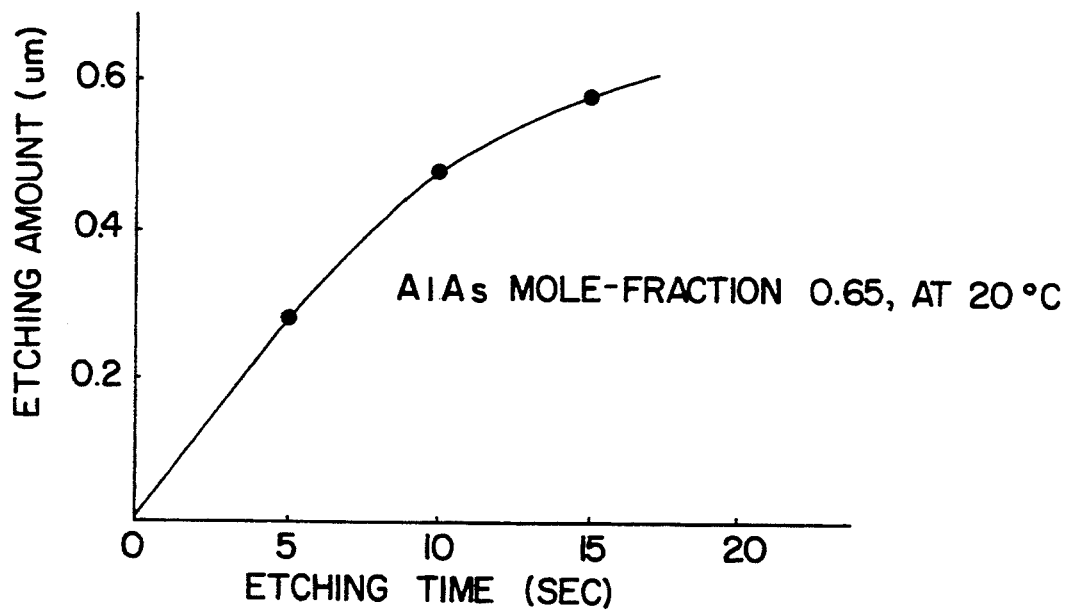

FIG. 12(b) shows how etching amount changes as a function of time at 20° C. for the current blocking layer having 0.65 as the AlAs mole-fraction. From this, it is learned that the etching amount reaches 0.5 um in about 10 seconds. The etching rate can be changed freely by changing the weight ratio of hydrogen fluoride to other solutions. As the hydrogen fluoride concentration decreases, the etching rate will decrease. As the etching solution temperature is increased, the etching rate can also be increased. Even under the foregoing conditions, the etching selectivity will not be lost. With this example, a first etching process by tartaic acid proceeded as far as just before reaching the second light guide layer and then a second selective etching process was applied for 5 seconds with a resulting production of a good stripe having excellent reproducibility.

In the foregoing example, only the case wherein a single layer of the GaAlAs layer was used as the first light guide layer was discussed. For the purpose of comparison in temperature characteristics, a device having a multi-quantum well barrier layer as shown in FIG. 2 included in the first light guide layer was additionally prepared.

The configuration of the stripe is desired to be like an ordinary mesa shape rather than an inverted mesa shape which presents some difficulties in crystal growth when compared with the case of the ordinary mesa shape, leading to deteriorated characteristics, and consequently bringing about a reduction in yield rates of the device. Actually, crystallization of the GaAlAs grown on the side areas of the window was damaged in the case of the inverted mesa shape and the threshold current of the device thus prepared was higher than that of the ordinary mesa shape by about 10 mA. The device characteristics to be discussed later will be of the device having the ordinary mesa shape.

When the impurity concentration $n_B$ of the current blocking layer falls short of $1 \times 10^{17}$ cm$^{-3}$ inclusive, the current pinching will not take place and the current will leak out of the stripe and when it exceeds $2 \times 10^{18}$ cm$^{-3}$ inclusive, a deterioration in crystallization of the current blocking layer will result and the side surfaces of the window will turn out irregular at the end of the etching process. In other words, no smooth faced mesa shape cannot be obtained. As a result, the crystallization of the p-type cladding layer 9 formed on the side areas of the window is damaged, leading to a reduction in the yield rate of the device due to the deteriorated characteristics. The measurement results are shown in Table 1. It is learned from Table 1 that the current pinching and the regrowth with good crystallization are performed by having $n_B$ adjusted to fall in the range of $1 \times 10^{17}$ to $2 \times 10^{18}$ cm$^{-3}$.

TABLE 1

| $n_B$ | $5 \times 10^{16}$ | $1 \times 10^{17}$ | $5 \times 10^{17}$ | $2 \times 10^{18}$ | (unit: cm$^{-3}$) $3 \times 10^{18}$ |
|---|---|---|---|---|---|
| Current Leakage | Yes | None | None | None | None |
| Crystallization of Regrowth Layer | Good | Good | Good | Good | Not Good |

In connection with the current blocking layer thickness, laser light will be absorbed by the p-type GaAs contact layer 8 located above the current blocking layer when the current blocking layer thickness is too small, so its limit needs to be 0.4 um minimum.

Figure 11C:
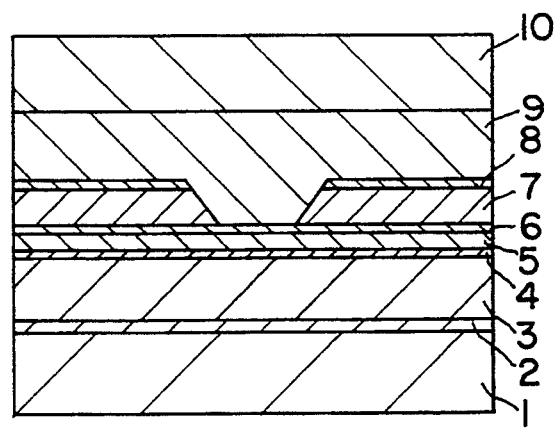

In the next, as shown in FIG. 11(c), the p-type Ga$_{0.5}$Al$_{0.5}$As cladding layer 9 and the p-type contact layer 10 were formed by the MOCVD or MBE growth method. At this time, the growth of the layer is facilitated inside the stripe where currents are flowing and the layer is deposited on the p-type Ga$_{0.8}$Al$_{0.2}$As second light guide layer 6 having a low AlAs mole-fraction. However, in case where Zn is used as a dopant for the p-type Ga$_{0.5}$Al$_{0.5}$As cladding layer 9, Zn will be diffused into the active layer of the stripe region during the growth process and there will be sometimes an adverse effect imposed to the temperature characteristics of the current-optical output performance of the device due to an increase in internal losses.

Particularly in the case of the quantum well structured active layer, there will be a danger of disturbances taking place in the quantum well due to the diffusion. In order to prevent this from occurring, it is needed to have the carrier density of the p-type layer made to be at least lower than $10^{18}$ cm$^{-3}$ inclusive. It was made to be $7 \times 10^{17}$ cm$^{-3}$ with the present example. As a complete countermeasure, the p-type Ga$_{0.5}$Al$_{0.5}$As cladding layer 9 should be doped with carbon, which is a dopant presenting not much diffusion. With the use of carbon, excellent temperature characteristics in the current-optical output performance can be achieved. Two kinds of devices were prepared with the present example, one using Zn and the other using carbon as dopants.

Then, electrodes were formed on the n-type GaAs substrate 1 and the p-type GaAs contact layer 10, respectively.

Figure 11D:
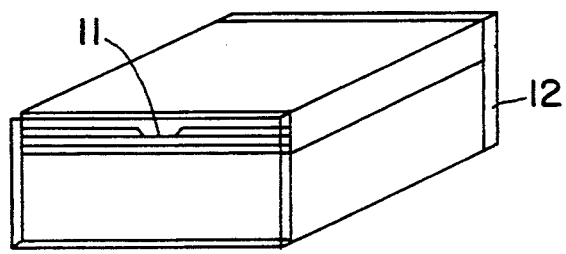
Figure 11E:
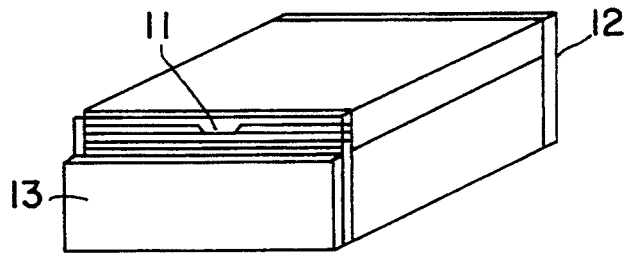
Figure 13:
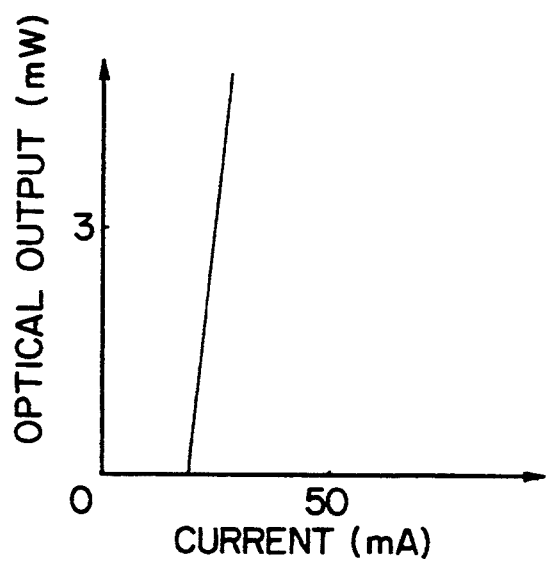
FIG. 13 shows the current-optical output characteristics of a semiconductor laser device as one embodiment example of the present invention.

Lastly, coating will be discussed. Two kinds of the facet reflectivity were tried. For the device having a multi-mode spectrum as shown in FIG. 13, the reflectivity was made to be 32% for the both facets and the composition of coating for the device with a reduced front facet reflectivity to gain a high output (FIG. 14) was made in such a way as to realize the design for the previously mentioned optical disc. The coating process to gain the high output will be explained here. First, as illustrated in FIG. 11(d), a dielectric material 11 such as alumina or the like was coated by sputtering on the front facet of the device to the thickness whereby the reflectivity reached 11%. The rear facet reflectivity was made to show 75% by employing a two-layer coating 12 of alumina and silicon. The rear facet reflectivity cannot necessarily be 75% but it is desired to be high for enhancing the slope efficiency. Furthermore, in order to reduce tracing noises caused by the reflection of the fedback light at the substrate surface, the reflectivity in the side of the substrate was made to be smaller than that of the area epitaxially grown as shown in FIG. 11(e). The epitaxially grown layer was masked by resist or the like and a dielectric layer 13 was additionally coated over the alumina so that the substrate reflectivity was reduced. Then, the resist was removed. With the present example, the substrate reflectivity was made to be 3%. There are other methods than above to reduce the substrate reflectivity. A dielectric material is first coated all over the front facet, for example, to make the reflectivity to be less than 3% and then the substrate is masked by resist or the like, followed by a process of etching off the dielectric layer of the epitaxially grown area until the reflectivity reaches 11%. Accordingly, an increase in noises due to the reflection of the fedback light at the substrate can be suppressed.

Although only the case where the GaAlAs having a small AlAs mole-fraction was used as the second light guide layer was described in the foregoing example, other materials also can be equally well used as far as such materials can meet the condition of lattice matching with GaAs and also such materials have a larger forbidden band width than the laser wave length to suppress light absorption. As another embodiment example $In_{0.5}Ga_{0.5}P$ can be used as the second light guide layer. In this case, too, the selective etching method can be used. Since there is no Al in the composition, the problem of surface oxidation will not result and the same characteristics will be obtainable.

Also, $In_{1-X}Ga_XAs_YP_{1-Y}$ can be used to obtain the same characteristics as the foregoing. Here, in order to meet the condition of lattice matching with GaAs, X and Y need to satisfy the relation of $0.189Y-0.418X+0.013XY+0.127=0$.

Besides, in order to make the forbidden band width to be larger than the energy E of the laser light, X and Y need to satisfy the relation of $1.35+0.672X-1.60Y+0.758X^2+0.101Y^2-0.157X-Y-0.312X^2Y+0.109XY^2>E$. In this case, too, there will be no surface oxidation problem in the fabrication process and the etching process can be stopped selectively at the second light guide layer.

As further another example, $In_{0.5}(Ga_{1-X}Al_X)_{0.5}P$ can be used as the second light guide layer. In this case, the forbidden band width will become larger than the laser wave length regardless of X and the condition of lattice matching will be met. However, an excessively large value of X will cause the problem of surface oxidation and X will be desired to meet the relation of $X<0.3$. In the etching process, the same selective etching of the current blocking layer can be performed as was in the foregoing, resulting in an improved control of etching.

FIG. 13 shows the current-optical output characteristics of a semiconductor laser device as one embodiment example of the present invention. The facet reflectivity was made to be 32%. In this particular example, the da was made to be 0.04 um and the dp was made to be 0.22 um for a reduction of noises and the spectrum was multi-mode, as shown in FIG. 3. However, since n was $5\times10^{-3}$, the lateral mode was single. With a device having a resonator length of 200 um. the operating current required to release 3 mW laser light at room temperature was 25 mA. A stable oscillation of the fundamental mode occurred for a lateral mode. A multimode oscillation causing self-pulsation in the 780 nm band in terms of the spectrum was taking place, achieving a low noise performance of −130 dB/Hz in relative intensity noise (RIN) within the fedback light ratio ranging from 0 to 10%. When Zn was used as the dopant for the regrowth process, the characteristic temperature was about 150 K. and when carbon was used as the dopant, the characteristic temperature was about 180 K. It was learned that a device having an excellent temperature performance was obtainable by using carbon that does not diffuse much as the p-type dopant. Besides, with the device with a multi-quantum well barrier layer introduced in the first light guide layer, the characteristic temperature extending as high as 200 K. was realized.

Besides, the structure disclosed by the present invention is characterized by a low operating current and is effective in the high output power operation of semiconductor laser devices. Particularly, even when the active layer thickness of the present structure is made to be as thin as 0.03 to 0.05 um, the spectrum can be made to be multi-mode, as shown in FIG. 3 and it will be possible to realize a semiconductor laser device of low noise and high output power in the visible spectra. When this kind of semiconductor laser device is employed as the light source for an optical disc, the high frequency superposing circuit used for a reduction of noises in reading can be eliminated, resulting in a greatly miniaturized pickup.

When the dp is reduced and the leakage current in the lateral direction is made small, the laser released will be presenting a single longitudinal mode and a high output power. Actually, with a device provided with a sufficient current pinching capability by making the active layer thickness to be 0.03 um, the dp to be 0.15 um and the $\Delta n$ to be $7\times10^{-3}$ for high power output, a 350 um long resonator and a high output power coating applied to the facets, it was possible to gain a light output power exceeding 100 mW. The particular coating employed with this device contributed to suppressing the relative intensity noise to as low as −130 dB/Hz under the condition of high frequency super-position at 3 mW.

Figure 14:
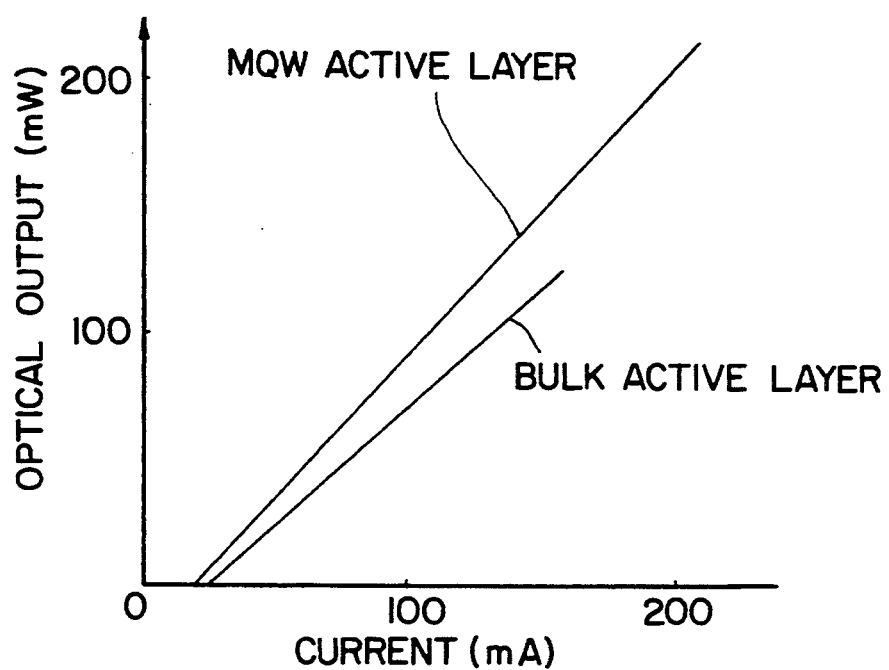
FIG. 14 also shows the current-optical output characteristics of a semiconductor laser device as one embodiment example of the present invention.

In the next, the case where a quantum well structure was used in the active layer for a more excellent performance of devices will be discussed. With a quantum well structure incorporated with the active layer, the threshold value will be further reduced and a higher output power will be gained. As the quantum well structure, a multi-quantum well (MQM) structure comprising four of a 10 nm thickness $Ga_{0.95}Al_{0.05}As$ well layer to oscillate in the 780 nm band and five of a 4 nm thickness $Ga_{0.7}Al_{0.3}As$ barrier layer was used and its current-optical output characteristics were as shown in FIG. 14. The dp was 0.2 um, the AlAs mole-fraction of the current blocking layer was 0.7 and the n was $6\times10^{-3}$. With the device after application of coating, an optical output power exceeding 200 mW was realized. In connection with the structure of the coating, a front facet reflectivity of 5 to 77% is required as learned from FIG. 9 and FIG. 10, in order to achieve an optical output exceeding 30 mW and satisfy the low noise requirement not exceeding −130 dB/Hz, according to the same was as discussed in case of the bulk active layer. With this particular example, the front facet reflectivity of 14% was used. At this time, the RIN was −142 dB/Hz under the condition of high frequency superposing at 3 mW. In addition, by having the reflectivity of the substrate reduced in the same way as applied to the foregoing bulk active layer, the tracking noises due to the fedback light reflection to the substrate will be reduced.

Besides, as the quantum well structure for the active layer, such other quantum well structures as a single quantum well (SQM) structure, a double quantum well (DQM) structure, a triple quantum well (TQM) structure and a GRIN structure or its separate confinement hetero structure (SCH) can equally well be used.

In the case of the quantum well structures, too, use of carbon as a dopant served to suppress the diffusion of dopant during the growth process and a characteristic temperature reaching as high as 250 K. was obtained. When Zn was used as a dopant, the characteristic temperature was about 200 K. Also, when a multi-quantum well barrier layer was introduced in the first light guide layer, a very high characteristic temperature of 280 K. was obtained.

Throughout all the foregoing examples, only the case where the substrate was n-type and the current blocking layer was also n-type has been discussed, but there will be not problem when the substrate is p-type and the current blocking layer is also p-type. The reason for this is that the AlAs mole-fraction of the current blocking layer is high. In the case a p-type GaAlAs layer having a high AlAs mole-fraction, the diffusion of electrons will be suppressed and it will become possible to realize a p-type blocking layer.

Also, in all the foregoing examples, the current blocking layer was located above the active layer. In other words, when looked from the side of the active layer, the current blocking layer was located in the opposite side of the substrate. However, the same effects will be obtained even when the current blocking layer is in the same side as the substrate. Furthermore, when a double confinement structure is employed, e.g., the current blocking layer is in each respective side of the substrate, the leakage current will be reduced and a low current operation will be achieved, as a matter of course.

Accordingly, the present invention makes it possible to realize readily a low operating current semiconductor laser device for the 780 nm band by having a certain conduction type $Ga_{1-y1}Al_{y1}As$ first guide layer and a $Ga_{1-y2}Al_{y2}As$ second light guide layer of said certain conduction type or a second light guide layer comprised of $In_{0.5}Ga_{0.5}P$ or $In_{0.5}(GaAl)_{0.5}P$, successively formed one upon another on at least one side of the principal plane of the active layer and at the same time by having an opposite conduction type $Ga_{1-z}Al_zAs$ layer with a stripe-like window, which is provided with a $Ga_{1-y3}Al_{y3}As$ layer of the same conduction type as that of the foregoing light guide layers, formed on the fore foregoing second light guide layer, wherein relations of $Z>Y3>Y2$ and $Y>Y2$ are established among Y1,Y2, Y3 and Z that define the AlAs mole-fractions.

Since carriers are confined into the active layer by the $Ga_{1-y1}Al_{y1}As$ having a high AlAs mole-fraction, causing regrowth to the second light guide layer having a low Al mole-fraction, a laser device for the visible spectra can be produced readily.

Particularly, by having a multi-quantum barrier layer formed in the first light guide layer, a device exhibiting a high characteristic temperature even for the visible spectra can be realized.

When stripes are formed by etching, the variation in etching extent can be reduced through use of a selective etching method to cope with differences in the AlAs mole-fractions, achieving a high yield rate.

Further, in case of a p-type buried layer, a device exhibiting an excellent temperature dependent performance in the current-optical output characteristics can be obtained by using carbon as a dopant at the time of regrowth with a resultant effect of suppressing the diffusion of the p-type dopants into the active layer.

Furthermore, in case of an n-type current blocking layer, by having the impurity density adjusted to somewhere between $1 \times 10^{17}$ and $2 \times 10^{18} cm^{-3}$, sufficient current pinching can be performed and also a good etching process of the stripe-like window and a good regrowth process of the sides of the window can be performed with resultant achievement of a good yield rate.

Also, since the AlAs mole-fraction of the current blocking layer is made higher than that of the cladding layer, the oscillation will take place in a single lateral mode and there will be no optical absorption of laser light by the current blocking layer, resulting in a low operating current.

Here, by having the first light guide layer thickness ranged from 0.05 um to 0.51 um in case of a bulk active layer and by having that ranged from 0.05 um to 0.40 um in case of a quantum well active layer, a stable single lateral mode oscillation and a high reliability can be realized.

In addition, since light is made to reach the current blocking layer and diffuse into the active layer located thereunder and also the effective refractive index step in the direction parallel to the junction plane can be made small due to the existence of the first light guide layer having a high AlAs mole-fraction, a multi-mode spectral oscillation can be easily taking place and a low noise performance can be achieved. Particularly, by using Si as a dopant of an n-type GaAsAs layer serving as a light guide, it will be become easier to make the spectra to be multi-mode.

Besides, by having the front facet reflectivity at the epitaxially grown layer ranged from 6 to 45% in case of a bulk active layer and having that ranged from 5 to 77% in case of a quantum well active layer, an optical output and a noise performance suitable for a rewritable optical disc can be obtained. Furthermore, by having the reflectivity of the substrate made smaller than that of the epitaxially grown section, the noises due to the reflection of the fedback light at the substrate can be reduced.

The laser light with low noises in the 780 nm band released at a low operating current is ideal as the light source for optical disc applications including a compact disc application. A reduction in the operating current, in particular, will result in a reduction of the heat dissipated in a laser mount section, making it possible to use a smaller and less heavy heat sink. As a result, use of resin in laser device packaging in place of metal as was with the prior art has been realized and it has become possible to design a small and low cost optical pickup.

Also, a low operating current will contribute to a reduction in the heat dissipated at the active layer and to a high output power gained from the laser device. Particularly, when the active layer is comprised of a quantum well structure, a higher output power will be gained. With the use of such a low noise and high output semiconductor laser device of the 780 nm band as disclosed by the present invention as the light source for an optical disc, it will become possible to eliminate the high frequency superposing circuit for reducing noises in reading, contributing to realization of an optical pickup having its dimensions greatly reduced.

What is claimed is:

1. A semiconductor laser device comprising a certain conduction type $Ga_{1-y1}Al_{y1}As$ first light guide layer and $In_{0.5}(GaAl)_{0.5}P$ second light guide layer, an opposite conduction type $Ga_{1-z}Al_zAs$ current blocking layer formed on said second light guide layer and provided with a stripe-like window and a $Ga_{1-y3}Al_{y3}As$ cladding layer of said certain conduction type formed over the areas including said stripe-like window where said current blocking layer is not being formed, all successively formed one upon another on at least one principal plane of an active layer comprised of a $Ga_{1-x}Al_xAs$ layer, wherein relations of $Z>Y3>X \geq 0$ and $Z>Y1$ are established among X, Y1, Y3 and Z that define the AlAs mole-fractions.

2. A semiconductor laser device comprising a certain conduction type $Ga_{1-y1}Al_{y1}As$ first light guide and $In_{0.5}Ga_{0.5}P$ second light guide layer, an opposite conduction type $Ga_{1-z}Al_zAs$ current blocking layer formed on said second light guide layer and provided with a stripe-like window and a $Ga_{1-Y3}Al_{Y3}As$ cladding layer of said certain conduction type formed over the areas including said stripe-like window where said current blocking layer is not being formed, all successively formed one upon another on at least one principal plane of an active layer having a quantum well structure, wherein relations of $Z>Y1$ and $Z>Y3$ are established among Y1, Y3 and Z that define the AlAs mole-fractions.

3. A semiconductor laser device comprising a certain conduction type $Ga_{1-Y1}Al_{Y1}As$ first light guide and InGaAsP second light guide layer, an opposite conduction type $GA_{1-Z}Al_ZAs$ current blocking layer formed on said second light guide layer and provided with a stripe-like window and a $Ga_{1-Y3}Al_{Y3}As$ cladding layer of said certain conduction type formed over the areas including said stripe-like window where said current blocking layer is not being formed, all successively formed one upon another on at least one principal plane of an active layer having a quantum well structure, wherein relations of $Z>Y3$ and $Z>Y1$ are established among Y1, Y3 and Z that define the AlAs mole-fractions.

4. A semiconductor laser device comprising a certain conduction type $Ga_{1-Y1}Al_{Y1}As$ first light guide and $In_{0.5}(GaAl)_{0.5}P$ second light guide layer, an opposite conduction type $Ga_{1-Z}Al_ZAs$ current blocking layer formed on said second light guide layer and provided with a stripe-like window and a $Ga_{1-Y3}Al_{Y3}As$ cladding layer of said certain conduction type formed over the areas including said stripe-like window where said current blocking layer is not being formed, all successively formed one upon another on at least one principal plane of an active layer having a quantum well structure, wherein relations of $Z>Y3$ and $Z>Y1$ are established among Y1, Y3 and Z that define the AlAs mole-fractions.

5. A semiconductor laser device comprising a certain conduction type $Ga_{1-Y1}Al_{Y1}As$ first light guide layer and $In_{0.5}Ga_{0.5}P$ second light guide layer, an opposite conduction type $GA_{1-Z}Al_ZAs$ current blocking layer formed on said second light guide layer and provided with a stripe-like window and a $Ga_{1-Y3}Al_{Y3}As$ cladding layer of said certain conduction type formed over the areas including said stripe-like window where said current blocking layer is not being formed, all successively formed one upon another on at least one principal plane of an active layer comprised of a $Ga_{1-X}Al_XAs$ layer, wherein relations of $Z>Y3>X\geq0$ and $Z>Y1$ are established among X, Y1, Y3 and Z that define the AlAs mole-fractions.

6. A semiconductor laser device comprising a certain conduction type $Ga_{1-Y1}Al_{Y1}As$ first light guide layer and InGaAsP second light guide layer, an opposite conduction type $GA_{1-Z}Al_ZAs$ current blocking layer formed on said second light guide layer and provided with a stripe-like window and a $Ga_{1-Y3}Al_{Y3}As$ cladding layer of said certain conduction type formed over the areas including said stripe-like window where said current blocking layer is not being formed, all successively formed one upon another on at least one principal plane of an active layer comprised of a $Ga_{1-X}Al_XAs$ layer, wherein relations of $Z>Y3>X\geq0$ and $Z>Y1$ is established among X, Y1, Y3 and Z that define the AlAs mole-fractions.

* * * * *